United States Patent [19]
Bloom et al.

[11] Patent Number: 5,808,797
[45] Date of Patent: Sep. 15, 1998

[54] METHOD AND APPARATUS FOR MODULATING A LIGHT BEAM

[75] Inventors: David M. Bloom, Portolla Valley; Francisco S. A. Sandejas, Menlo Park; Olav Solgaard, Palo Alto, all of Calif.

[73] Assignee: Silicon Light Machines, Sunnyvale, Calif.

[21] Appl. No.: 638,605

[22] Filed: Apr. 26, 1996

Related U.S. Application Data

[60] Division of Ser. No. 591,231, Jan. 18, 1996, which is a continuation-in-part of Ser. No. 404,139, Mar. 13, 1995, Pat. No. 5,677,738, which is a division of Ser. No. 62,688, May 20, 1993, Pat. No. 5,459,610, which is a continuation-in-part of Ser. No. 876,078, Apr. 28, 1992, Pat. No. 5,311,360.

[51] Int. Cl.$^6$ .................................................. G02B 5/18
[52] U.S. Cl. ........................ 359/572; 345/108; 348/755
[58] Field of Search ........................... 359/35, 573, 572; 349/86; 348/755; 345/31, 85, 108

[56] References Cited

U.S. PATENT DOCUMENTS

| | | | |
|---|---|---|---|
| Re. 16,767 | 10/1927 | Jenkins | 359/291 |
| 1,525,550 | 2/1925 | Jenkins | 359/291 |
| 1,548,262 | 8/1925 | Freedman | 283/67 |
| 1,814,701 | 7/1931 | Ives | 359/462 |
| 2,415,226 | 2/1947 | Sziklai | 178/5.4 |
| 2,783,406 | 2/1957 | Vanderhooft | 313/70 |
| 2,991,690 | 7/1961 | Grey et al. | 88/16.6 |
| 3,553,364 | 1/1971 | Lee | 178/7.3 |
| 3,576,394 | 4/1971 | Lee | 178/7.3 |
| 3,600,798 | 8/1971 | Lee | 29/592 |
| 3,656,837 | 4/1972 | Sandbank | 359/291 |

(List continued on next page.)

FOREIGN PATENT DOCUMENTS

| | | | |
|---|---|---|---|
| 0 417 039 A1 | 3/1991 | European Pat. Off. | G03B 21/20 |
| 0 610 665 A1 | 8/1994 | European Pat. Off. | G09G 3/34 |
| 0 658 868 A1 | 6/1995 | European Pat. Off. | G09G 3/34 |
| 63-305323 | 12/1988 | Japan | G02F 1/13 |
| WO 093/02269 | 2/1993 | WIPO | E06B 5/10 |
| WO 093/09472 | 5/1993 | WIPO | G03F 7/20 |

OTHER PUBLICATIONS

R. Apte, F. Sandejas, W. Banyai, D. Bloom, "Grating Light Valves For High Resolution Displays", Ginzton Laboratories, Stanford University, Stanford, CA 94305–4085, Jun. 1994.

R. Apte, Grating Light Valves For High Resolution Displays Jun. 1994, Ginzton Laboratories, Stanford Univ., Stanford, CA.

O. Solgaard, Integrated Semiconductor Light Modulators For Fiber–Optic And Display Applications, Feb., 1992, Stanford Univ., Stanford, CA.

(List continued on next page.)

*Primary Examiner*—Paul M. Dzierzynski
*Assistant Examiner*—John Juba, Jr.
*Attorney, Agent, or Firm*—Haverstock & Owens LLP

[57] ABSTRACT

A modulator for modulating incident rays of light, the modulator having a plurality of equally spaced apart elements, each of which includes a light reflective planar surface. The elements are arranged parallel to each other with their light reflective surfaces parallel to each other. The modulator includes means for supporting elements in relation to one another and means for moving particular ones of the elements relative to others so that the moved elements transit between a first configuration wherein the modulator acts to reflect the incident rays of light as a plane mirror, and a second configuration wherein the modulator diffracts the light reflected therefrom. In operation, the light reflective surfaces of the elements remain parallel to each other in both the first and the second configurations. The perpendicular spacing between the reflective surfaces of respective elements is equal to m/4 times the wavelength of the incident rays of light, wherein m=an even whole number or zero when the elements are in the first configuration and m=an odd whole number when the elements are in the second configuration.

22 Claims, 4 Drawing Sheets

U.S. PATENT DOCUMENTS

| | | | |
|---|---|---|---|
| 3,802,769 | 4/1974 | Rotz et al. | 352/43 |
| 3,886,310 | 5/1975 | Guldberg et al. | 178/7.5 D |
| 3,896,338 | 7/1975 | Nathanson et al. | 315/373 |
| 3,935,499 | 1/1976 | Oess' | 315/373 |
| 3,935,500 | 1/1976 | Oess et al. | 313/495 |
| 3,947,105 | 3/1976 | Smith | 353/121 |
| 3,969,611 | 7/1976 | Fonteneau | 219/502 |
| 4,001,663 | 1/1977 | Bray | 321/2 |
| 4,009,939 | 3/1977 | Okano | 359/589 |
| 4,012,116 | 3/1977 | Yevick | 359/465 |
| 4,017,158 | 4/1977 | Booth | 359/567 |
| 4,020,381 | 4/1977 | Oess et al. | 313/302 |
| 4,067,129 | 1/1978 | Abramson et al. | 40/563 |
| 4,084,437 | 4/1978 | Finnegan | 73/361 |
| 4,093,346 | 6/1978 | Nishino et al. | 348/292 |
| 4,093,921 | 6/1978 | Buss | 325/459 |
| 4,093,922 | 6/1978 | Buss | 325/459 |
| 4,127,322 | 11/1978 | Jacobson et al. | 353/31 |
| 4,135,502 | 1/1979 | Peck | 128/76.5 |
| 4,139,257 | 2/1979 | Matsumoto | 359/239 |
| 4,163,570 | 8/1979 | Greenway | 283/8 A |
| 4,184,700 | 1/1980 | Greenaway | 283/6 |
| 4,211,918 | 7/1980 | Nyfeler et al. | 235/454 |
| 4,223,050 | 9/1980 | Nufeler et al. | 427/163 |
| 4,225,913 | 9/1980 | Bray | 363/97 |
| 4,250,217 | 2/1981 | Greenaway | 428/161 |
| 4,250,393 | 2/1981 | Greenaway | 250/566 |
| 4,327,411 | 4/1982 | Turner | 364/900 |
| 4,327,966 | 5/1982 | Bloom | 350/162 R |
| 4,338,660 | 7/1982 | Kelley et al. | 364/200 |
| 4,408,884 | 10/1983 | Kleinknecht et al. | 356/355 |
| 4,418,397 | 11/1983 | Brantingham et al. | 364/900 |
| 4,420,717 | 12/1983 | Wallace et al. | 318/696 |
| 4,430,584 | 2/1984 | Someshwar et al. | 307/465 |
| 4,440,839 | 4/1984 | Mottier | 430/2 |
| 4,443,819 | 4/1984 | Funada et al. | 358/236 |
| 4,443,845 | 4/1984 | Hamilton et al. | 364/200 |
| 4,447,881 | 5/1984 | Brantingham et al. | 364/488 |
| 4,454,591 | 6/1984 | Lou | 364/900 |
| 4,468,725 | 8/1984 | Venturini | 363/160 |
| 4,484,188 | 11/1984 | Ott | 340/728 |
| 4,492,435 | 1/1985 | Banton et al. | 350/360 |
| 4,503,494 | 3/1985 | Hamilton et al. | 364/200 |
| 4,556,378 | 12/1985 | Nyfeler et al. | 425/143 |
| 4,561,044 | 12/1985 | Ogura et al. | 362/84 |
| 4,566,935 | 1/1986 | Hornbeck | 156/626 |
| 4,571,041 | 2/1986 | Gaudyn | 353/10 |
| 4,571,603 | 2/1986 | Hornbeck et al. | 346/160 |
| 4,590,548 | 5/1986 | Maytum | 363/161 |
| 4,594,501 | 6/1986 | Culley et al. | 219/492 |
| 4,596,992 | 6/1986 | Hornbeck | 346/79 PH |
| 4,615,595 | 10/1986 | Hornbeck | 353/122 |
| 4,623,219 | 11/1986 | Trias | 350/351 |
| 4,645,881 | 2/1987 | LeToumelin et al. | 379/252 |
| 4,646,158 | 2/1987 | Ohno et al. | 358/236 |
| 4,652,932 | 3/1987 | Miyajima et al. | 358/236 |
| 4,655,539 | 4/1987 | Caulfield et al. | 350/3.6 |
| 4,662,746 | 5/1987 | Hornbeck | 350/269 |
| 4,663,670 | 5/1987 | Ito et al. | 358/245 |
| 4,710,732 | 12/1987 | Hornbeck | 332/7.51 |
| 4,714,236 | 12/1987 | Usui et al. | 350/485 |
| 4,719,507 | 1/1988 | Bos | 358/92 |
| 4,728,185 | 3/1988 | Thomas | 353/122 |
| 4,744,633 | 5/1988 | Sheiman | 350/132 |
| 4,751,509 | 6/1988 | Kubota et al. | 340/784 |
| 4,761,253 | 8/1988 | Antes | 264/1.3 |
| 4,772,094 | 9/1988 | Sheiman | 350/133 |
| 4,772,593 | 9/1988 | Shimazaki | 350/336 |
| 4,803,560 | 2/1989 | Matsunaga et al. | 358/236 |
| 4,807,965 | 2/1989 | Garakani | 350/131 |
| 4,809,078 | 2/1989 | Yabe et al. | 358/236 |
| 4,811,210 | 3/1989 | McAulay | 364/200 |
| 4,814,759 | 3/1989 | Gombrich et al. | 340/771 |
| 4,827,391 | 5/1989 | Sills | 363/41 |
| 4,829,365 | 5/1989 | Eichenlaub | 358/3 |
| 4,856,863 | 8/1989 | Sampsell et al. | 350/96.16 |
| 4,856,869 | 8/1989 | Sakata et al. | 350/162.18 |
| 4,859,012 | 8/1989 | Cohn | 350/96.24 |
| 4,866,488 | 9/1989 | Frensley | 357/4 |
| 4,915,463 | 4/1990 | Barbee, jr. | 350/1.1 |
| 4,915,479 | 4/1990 | Clarke | 350/345 |
| 4,952,925 | 8/1990 | Haastert | 340/784 |
| 4,954,789 | 9/1990 | Sampsell | 330/4.3 |
| 4,956,619 | 9/1990 | Hornbeck | 330/4.3 |
| 4,978,202 | 12/1990 | Yang | 350/331 R |
| 4,982,184 | 1/1991 | Kirkwood | 340/783 |
| 4,984,824 | 1/1991 | Antes et al. | 283/91 |
| 5,018,256 | 5/1991 | Hornbeck | 29/25.01 |
| 5,022,750 | 6/1991 | Flasck | 353/31 |
| 5,024,494 | 6/1991 | Williams et al. | 350/3.6 |
| 5,028,939 | 7/1991 | Hornbeck et al. | 346/160 |
| 5,035,473 | 7/1991 | Kuwayama et al. | 350/3.7 |
| 5,037,173 | 8/1991 | Sampsell et al. | 385/17 |
| 5,041,851 | 8/1991 | Nelson | 346/160 |
| 5,058,992 | 10/1991 | Takahashi | 359/567 |
| 5,060,058 | 10/1991 | Goldenberg et al. | 358/60 |
| 5,061,049 | 10/1991 | Hornbeck | 359/224 |
| 5,072,239 | 12/1991 | Mitcham et al. | 346/108 |
| 5,072,418 | 12/1991 | Boutaud et al. | 364/715.06 |
| 5,079,544 | 1/1992 | DeMond et al. | 340/701 |
| 5,083,857 | 1/1992 | Hornbeck | 359/291 |
| 5,089,903 | 2/1992 | Kuwayama et al. | 359/15 |
| 5,096,279 | 3/1992 | Hornbeck et al. | 359/230 |
| 5,099,353 | 3/1992 | Hornbeck | 359/291 |
| 5,101,184 | 3/1992 | Antes | 235/454 |
| 5,101,236 | 3/1992 | Nelson et al. | 355/229 |
| 5,105,207 | 4/1992 | Nelson | 346/160 |
| 5,105,299 | 4/1992 | Anderson et al. | 359/223 |
| 5,105,369 | 4/1992 | Nelson | 364/525 |
| 5,113,285 | 5/1992 | Franklin et al. | 359/465 |
| 5,119,204 | 6/1992 | Hashimoto et al. | 358/254 |
| 5,121,343 | 6/1992 | Faris | 395/111 |
| 5,128,660 | 7/1992 | DeMond et al. | 340/707 |
| 5,129,716 | 7/1992 | Holakovzky et al. | 351/50 |
| 5,132,812 | 7/1992 | Takahashi et al. | 359/9 |
| 5,142,303 | 8/1992 | Nelson | 346/108 |
| 5,142,405 | 8/1992 | Hornbeck | 359/226 |
| 5,142,677 | 8/1992 | Ehlig et al. | 395/650 |
| 5,148,157 | 9/1992 | Florence | 340/783 |
| 5,148,506 | 9/1992 | McDonald | 385/16 |
| 5,151,718 | 9/1992 | Nelson | 346/160 |
| 5,155,604 | 10/1992 | Miekka et al. | 359/2 |
| 5,155,778 | 10/1992 | Magel et al. | 385/18 |
| 5,155,812 | 10/1992 | Ehlig et al. | 395/275 |
| 5,159,485 | 10/1992 | Nelson | 359/291 |
| 5,161,042 | 11/1992 | Hamada | 359/41 |
| 5,162,787 | 11/1992 | Thompson | 340/794 |
| 5,165,013 | 11/1992 | Faris | 395/104 |
| 5,168,406 | 12/1992 | Nelson | 359/855 |
| 5,170,156 | 12/1992 | DeMond et al. | 340/794 |
| 5,170,269 | 12/1992 | Lin et al. | 359/9 |
| 5,170,283 | 12/1992 | O'Brien et al. | 359/291 |
| 5,172,161 | 12/1992 | Nelson | 355/200 |
| 5,172,262 | 12/1992 | Hornbeck | 359/223 |
| 5,176,274 | 1/1993 | Sampsell | 250/208.2 |
| 5,178,728 | 1/1993 | Boysel et al. | 156/656 |
| 5,179,367 | 1/1993 | Shimizu | 340/700 |
| 5,181,231 | 1/1993 | Parikh et al. | 377/26 |
| 5,192,946 | 3/1993 | Thompson et al. | 340/794 |
| 5,202,785 | 4/1993 | Nelson | 359/214 |

| Patent No. | Date | Name | Class |
|---|---|---|---|
| 5,206,629 | 4/1993 | DeMond et al. | 340/719 |
| 5,212,555 | 5/1993 | Stoltz | 358/206 |
| 5,212,582 | 5/1993 | Nelson | 359/224 |
| 5,214,419 | 5/1993 | DeMond et al. | 340/794 |
| 5,214,420 | 5/1993 | Thompson et al. | 340/795 |
| 5,216,537 | 6/1993 | Hornbeck | 359/291 |
| 5,221,982 | 6/1993 | Faris | 359/93 |
| 5,226,099 | 7/1993 | Mignardi et al. | 385/19 |
| 5,231,363 | 7/1993 | Sano et al. | 332/109 |
| 5,231,388 | 7/1993 | Stoltz | 340/783 |
| 5,233,456 | 8/1993 | Nelson | 359/214 |
| 5,237,340 | 8/1993 | Nelson | 346/108 |
| 5,237,435 | 8/1993 | Kurematsu et al. | 359/41 |
| 5,240,818 | 8/1993 | Mignardi et al | 430/321 |
| 5,245,686 | 9/1993 | Faris et al. | 385/120 |
| 5,247,180 | 9/1993 | Mitcham et al. | 250/492.1 |
| 5,247,593 | 9/1993 | Lin et al. | 385/17 |
| 5,254,980 | 10/1993 | Hendrix et al. | 345/84 |
| 5,255,100 | 10/1993 | Urbanus | 358/231 |
| 5,256,869 | 10/1993 | Lin et al. | 250/201.9 |
| 5,272,473 | 12/1993 | Thompson et al. | 345/7 |
| 5,278,652 | 1/1994 | Urbanus et al. | 358/160 |
| 5,278,925 | 1/1994 | Boysel et al. | 385/14 |
| 5,280,277 | 1/1994 | Hornbeck | 345/108 |
| 5,281,957 | 1/1994 | Schoolman | 345/8 |
| 5,285,196 | 2/1994 | Gale, Jr. | 345/108 |
| 5,285,407 | 2/1994 | Gale et al. | 365/189.11 |
| 5,287,096 | 2/1994 | Thompson et al. | 345/147 |
| 5,287,215 | 2/1994 | Warde et al. | 359/293 |
| 5,289,172 | 2/1994 | Gale, Jr. et al. | 345/108 |
| 5,291,317 | 3/1994 | Newswanger | 359/15 |
| 5,291,473 | 3/1994 | Pauli | 369/112 |
| 5,293,511 | 3/1994 | Poradish et al. | 257/434 |
| 5,296,950 | 3/1994 | Lin et al. | 359/9 |
| 5,299,037 | 3/1994 | Sakata | 359/41 |
| 5,301,062 | 4/1994 | Takahashi et al. | 359/567 |
| 5,303,055 | 4/1994 | Hendrix et al. | 348/761 |
| 5,307,056 | 4/1994 | Urbanus | 340/189 |
| 5,307,185 | 4/1994 | Jones et al. | 359/41 |
| 5,311,349 | 5/1994 | Anderson et al. | 359/223 |
| 5,311,360 | 5/1994 | Bloom et al. | 359/572 |
| 5,312,513 | 5/1994 | Florence et al. | 156/643 |
| 5,313,479 | 5/1994 | Florence | 372/26 |
| 5,313,648 | 5/1994 | Ehlig et al. | 395/800 |
| 5,315,418 | 5/1994 | Sprague et al. | 359/41 |
| 5,319,214 | 6/1994 | Gregory et al. | 250/504 R |
| 5,319,789 | 6/1994 | Ehlig et al. | 395/800 |
| 5,319,792 | 6/1994 | Ehlig et al. | 395/800 |
| 5,323,002 | 6/1994 | Sampsell et al. | 250/252.1 |
| 5,325,116 | 6/1994 | Sampsell | 346/108 |
| 5,327,286 | 7/1994 | Sampsell et al. | 359/561 |
| 5,330,878 | 7/1994 | Nelson | 430/311 |
| 5,331,454 | 7/1994 | Hornbeck | 359/224 |
| 5,339,116 | 8/1994 | Urbanus et al. | 348/716 |
| 5,339,177 | 8/1994 | Jenkins et al. | 359/35 |
| 5,345,521 | 9/1994 | McDonald et al. | 385/19 |
| 5,347,321 | 9/1994 | Gove | 348/663 |
| 5,347,433 | 9/1994 | Sedmayr | 362/32 |
| 5,348,619 | 9/1994 | Bohannon et al. | 156/664 |
| 5,349,687 | 9/1994 | Ehlig et al. | 395/800 |
| 5,351,052 | 9/1994 | D'Hont et al. | 342/42 |
| 5,357,369 | 10/1994 | Pilling et al. | 359/462 |
| 5,359,349 | 10/1994 | Jambor et al. | 345/168 |
| 5,363,220 | 11/1994 | Kuwayama et al. | 359/3 |
| 5,365,283 | 11/1994 | Doherty et al. | 348/743 |
| 5,367,585 | 11/1994 | Ghezzo et al. | 385/23 |
| 5,371,543 | 12/1994 | Anderson | 348/270 |
| 5,382,961 | 1/1995 | Gale, Jr. | 345/108 |
| 5,387,924 | 2/1995 | Gale, Jr. et al. | 345/108 |
| 5,389,182 | 2/1995 | Mignardi | 156/344 |
| 5,392,140 | 2/1995 | Ezra et al. | 359/41 |
| 5,392,151 | 2/1995 | Nelson | 359/223 |
| 5,398,071 | 3/1995 | Gove et al. | 348/558 |
| 5,410,315 | 4/1995 | Huber | 342/42 |
| 5,411,769 | 5/1995 | Hornbeck | 427/534 |
| 5,412,186 | 5/1995 | Gale | 219/679 |
| 5,418,584 | 5/1995 | Larson | 353/122 |
| 5,420,655 | 5/1995 | Shimizu | 353/33 |
| 5,430,524 | 7/1995 | Nelson | 355/200 |
| 5,435,876 | 7/1995 | Alfaro et al. | 156/247 |
| 5,442,411 | 8/1995 | Urbanus et al. | 348/771 |
| 5,442,414 | 8/1995 | Janssen et al. | 353/98 |
| 5,444,566 | 8/1995 | Gale et al. | 359/291 |
| 5,445,559 | 8/1995 | Gale et al. | 451/388 |
| 5,446,479 | 8/1995 | Thompson et al. | 345/139 |
| 5,447,600 | 9/1995 | Webb | 216/2 |
| 5,448,314 | 9/1995 | Heimbuch et al. | 348/743 |
| 5,448,546 | 9/1995 | Pauli | 369/112 |
| 5,450,088 | 9/1995 | Meier et al. | 342/51 |
| 5,450,219 | 9/1995 | Gold et al. | 359/40 |
| 5,451,103 | 9/1995 | Hatanaka et al. | 353/31 |
| 5,452,024 | 9/1995 | Sampsell | 348/755 |
| 5,452,138 | 9/1995 | Mignardi et al. | 359/855 |
| 5,453,747 | 9/1995 | D'Hont et al. | 342/42 |
| 5,453,778 | 9/1995 | Venkateswar et al. | 347/239 |
| 5,453,803 | 9/1995 | Shapiro et al. | 353/119 |
| 5,454,906 | 10/1995 | Baker et al. | 216/66 |
| 5,455,602 | 10/1995 | Tew | 347/239 |
| 5,457,493 | 10/1995 | Leddy et al. | 348/164 |
| 5,457,566 | 10/1995 | Sampsell et al. | 359/292 |
| 5,458,716 | 10/1995 | Alfaro et al. | 156/245 |
| 5,459,492 | 10/1995 | Venkateswar | 347/253 |
| 5,459,528 | 10/1995 | Pettitt | 348/568 |
| 5,459,592 | 10/1995 | Shibatani et al. | 359/40 |
| 5,459,610 | 10/1995 | Bloom et al. | 359/572 |
| 5,461,410 | 10/1995 | Venkateswar et al. | 347/240 |
| 5,461,411 | 10/1995 | Florence et al. | 347/240 |
| 5,461,547 | 10/1995 | Ciupke et al. | 362/31 |
| 5,463,347 | 10/1995 | Jones et al. | 330/253 |
| 5,465,175 | 11/1995 | Woodgate et al. | 359/463 |
| 5,467,106 | 11/1995 | Salomon | 345/87 |
| 5,467,138 | 11/1995 | Gove | 348/452 |
| 5,467,146 | 11/1995 | Huang et al. | 348/743 |
| 5,469,302 | 11/1995 | Lim | 359/846 |
| 5,481,118 | 1/1996 | Tew | 250/551 |
| 5,482,564 | 1/1996 | Douglas et al. | 134/18 |
| 5,482,818 | 1/1996 | Nelson | 430/394 |
| 5,483,307 | 1/1996 | Anderson | 353/98 |
| 5,485,304 | 1/1996 | Kaeriyama | 359/291 |
| 5,485,354 | 1/1996 | Ciupke et al. | 362/31 |
| 5,486,698 | 1/1996 | Hanson et al. | 250/332 |
| 5,486,841 | 1/1996 | Hara et al. | 345/8 |
| 5,488,431 | 1/1996 | Gove et al. | 348/716 |
| 5,489,952 | 2/1996 | Gove et al. | 348/771 |
| 5,490,009 | 2/1996 | Venkateswar et al. | 359/291 |
| 5,491,510 | 2/1996 | Gove | 348/77 |
| 5,491,715 | 2/1996 | Flaxl | 375/344 |
| 5,497,172 | 3/1996 | Doherty et al. | 345/85 |
| 5,497,197 | 3/1996 | Gove et al. | 348/388 |
| 5,497,262 | 3/1996 | Kaeriyama | 359/223 |
| 5,499,060 | 3/1996 | Gove et al. | 348/651 |
| 5,499,062 | 3/1996 | Urbanus | 348/771 |
| 5,500,761 | 3/1996 | Goossen et al. | 359/290 |
| 5,502,481 | 3/1996 | Dentinger et al. | 348/51 |
| 5,504,504 | 4/1996 | Markandey et al. | 345/214 |
| 5,504,514 | 4/1996 | Nelson | 347/130 |
| 5,504,575 | 4/1996 | Stafford | 356/330 |
| 5,504,614 | 4/1996 | Webb et al. | 359/223 |
| 5,506,171 | 4/1996 | Leonard et al. | 437/187 |
| 5,506,597 | 4/1996 | Thompson et al. | 345/85 |
| 5,506,720 | 4/1996 | Yoon | 359/224 |
| 5,508,750 | 4/1996 | Hewlett et al. | 348/558 |
| 5,508,840 | 4/1996 | Vogel et al. | 359/291 |
| 5,508,841 | 4/1996 | Lin et al. | 359/318 |

| | | | |
|---|---|---|---|
| 5,510,824 | 4/1996 | Nelson | 347/239 |
| 5,512,374 | 4/1996 | Wallace et al. | 428/422 |
| 5,512,748 | 4/1996 | Hanson | 250/332 |
| 5,515,076 | 5/1996 | Thompson et al. | 345/139 |
| 5,516,125 | 5/1996 | McKenna | 279/3 |
| 5,517,340 | 5/1996 | Doany et al. | 359/41 |
| 5,517,347 | 5/1996 | Sampsell | 359/224 |
| 5,519,450 | 5/1996 | Urbanus et al. | 348/600 |
| 5,523,803 | 6/1996 | Urbanus et al. | 348/771 |
| 5,523,878 | 6/1996 | Wallace et al. | 359/290 |
| 5,523,881 | 6/1996 | Florence et al. | 359/561 |
| 5,524,155 | 6/1996 | Weaver | 385/24 |

OTHER PUBLICATIONS

J. Neff, "Two–Dimensional Spatial Light Modulators: A Tutorial", *Proceedings of the IEEE,* vol. 78, No. 5 (May 1990), pp. 826–855.

Gerhard–Multhaupt, "Viscoelastic Spatial Light Modulators and Schlieren–Optical Systems for HDTV Projection Displays", *SPIE* vol. 1255 Large Screen Displays II (1990), pp. 69–78.

Gerhard–Multhaupt, "Light–Valve Technologies for High–Definition Television Projection Displays", *Displays,* vol. 12, No. 3/4 (1991), pp. 115–128.

METHOD AND APPARATUS FOR MODULATING A LIGHT BEAM

This application is a divisional application of U.S. patent application Ser. No. 08/591,231, filed Jan. 18, 1996, still pending which is a continuation-in-part of U.S. patent application Ser. No. 08/404,139, filed Mar. 13, 1995, and issued as U.S. Pat. No. 5,677,738 on Oct. 14, 1997, which is a division of U.S. patent application Ser. No. 08/062,688, filed May 20, 1993 and issued as U.S. Pat. No. 5,459,610 on Oct. 17, 1995, which is a continuation-in-part of U.S. patent application Ser. No. 07/876,078, filed Apr. 28, 1992 and issued as U.S. Pat. No. 5,311,360 on May 10, 1994. This application only claims and discloses information found in the first filed application in this chain of pendency.

BACKGROUND OF THE INVENTION

1. Field of the Invention

This invention relates to a method and apparatus for modulating a light beam and more particularly to the use of a reflective, deformable diffraction grating for performing such modulation.

2. Brief Description of the Prior Art

Devices which modulate a light beam, e.g. by altering the amplitude, frequency or phase of the light, find a number of applications. An example of such a device is a spatial light modulator (SLM) which is an electronically or optically controlled device which consists of one or two-dimensional reconfigurable patterns of pixel elements, each of which can individually modulate the amplitude, phase or polarization of an optical wavefront.

These devices have been extensively developed, particularly for applications in the areas of optical processing and computing. They can perform a variety of functions such as: analog multiplication and addition, signal conversion (electrical-to-optical, incoherent-to-coherent, amplification, etc.), nonlinear operations and short term storage. Utilizing these functions, SLMs have seen many different applications from display technology to optical signal processing. For example, SLMs have been used as optical correlators (e.g., pattern recognition devices, programmable holograms), optical matrix processors (e.g., matrix multipliers, optical cross-bar switches with broadcast capabilities, optical neural networks, radar beam forming), digital optical architectures (e.g., highly parallel optical computers) and displays.

The requirements for SLM technology depend strongly on the application in mind: for example, a display requires low bandwidth but a high dynamic range while optical computers benefit from high response times but don't require such high dynamic ranges. Generally, systems designers require SLMs with characteristics such as: high resolution, high speed (kHz frame rates), good gray scale, high contrast ratio or modulation depth, optical flatness, VLSI compatible, easy handling capability and low cost. To date, no one SLM design can satisfy all the above requirements. As a result, different types of SIMs have been developed for different applications, often resulting in tradeoffs.

Texas Instruments, for instance, has developed a "Deformable Mirror Device (DMD)" that utilizes an electromechanical means of deflecting an optical beam. The mechanical motions needed for the operation of the DMD are relatively large and, as a result, the bandwidths are limited to tens of kilohertz. This device, however, gives good contrast ratios and high-resolution and is, furthermore, compatible with CMOS, and other low power technologies.

Nematic and ferroelectric liquid crystals have also been used as the active layer in several SLMS. Since the electrooptic effect in liquid crystals is based on the mechanical reorientation of molecular dipoles, it is to be expected that liquid crystals are faster than the DMD-type devices. Modulators using ferroelectric liquid crystals have exhibited moderate switching speeds (150 $\mu$sec to 100 nsec), low-power consumption, VLSI compatible switching voltages (5–10 V), high extinction ratios, high resolution and large apertures. However, these devices suffer from the drawbacks of limited liquid crystal lifetimes and operating temperature ranges. In addition, the manufacturing process is complicated by alignment problems and film thickness uniformity issues.

Magnetooptic modulation schemes have been used to achieve faster switching speeds and to provide an optical pattern memory cell. Although these devices, in addition to achieving fast switching speeds, can achieve large contrast ratios, they suffer from a low (<10%) throughput efficiency and are, therefore, often unsuitable for many applications.

The need is therefore for a light modulation device which overcomes these drawbacks.

Beside SLMs, another area of use of light modulators is in fiber optics. Fiber optic modulators are electronically controlled devices that modulate light intensity and are designed to be compatible with optical fibers. For high speed communication applications, lithium niobate ($LiNbO_3$) traveling wave modulators represent the state-of-the-art, but there is a need for low power, high efficiency, low loss, inexpensive fiber optic modulators, that can be integrated with silicon sensors and electronics, for data acquisition and medical applications.

A typical use of a modulator combined with fiber optic technology, for example, is a data acquisition system on an airplane which consists of a central data processing unit that gathers data from remote sensors. Because of their lightweight and electromagnetic immunity characteristics, fiber optics provide an ideal communication medium between the processor and the sensors which produce an electrical output that must be converted to an optical signal for transmission. The most efficient way to do this is to have a continuous wave laser at the processor and a modulator operating in reflection at the sensor. In this configuration, it is also possible to deliver power to the sensor over the fiber.

In this type of application the modulator should operate with high contrast and low insertion loss to maximize the signal to noise ratio and have low power consumption. It should further be compatible with silicon technology because the sensors and signal conditioning electronics used in these systems are largely implemented in silicon.

Another use of a modulator combined with fiber optic technology is in the monitoring of sensors that are surgically implanted in the human body. Here optical fibers are preferred to electrical cables because of their galvanic isolation, and any modulator used in these applications should exhibit high contrast combined with low insertion loss because of signal to noise considerations. Furthermore, as size is important in implanted devices, the modulator must be integratable with silicon sensors and electronics.

There exist no prior art devices that have the characteristics enumerated above. Modulators based on the electrooptic, Franz-Keldysh, Quantum-Confined-Stark or Wannier-Stark effect in III–V semiconductors have high contrast and low insertion loss, but are expensive and not compatible with silicon devices. Waveguide modulators employing glass or epilayers on silicon, require too much area and too complex fabrication to be easily integratable with other silicon devices. Silicon modulators that do not employ waveguides and that are based on the plasma effect, require high electrical drive power and do not achieve high contrast.

The need is therefore for a light modulator which can be used with fiber optic technology with low power, high efficiency, low loss, low cost and compatibility with multi-mode optical fibers and silicon technology.

SUMMARY OF THE INVENTION

Objects of the Invention

Accordingly, it is an object of this invention to provide a light modulator which alone or together with other modulators exhibits most of the following characteristics: high resolution, high speed (Khz frame rates), gray levels (100 levels), high contrast ratio or modulation depth, optical flatness, VLSI compatible, easy handling capability and low cost. A further object of this invention is to provide a light modulator which has a tolerance for high optical power and good optical throughput.

Yet another object of this invention is to provide a light modulator which is compatible with CMOS technology.

Still another object of this invention is to provide a light modulator capable of use with fiber optic technology.

A final object of this invention is to provide a light modulator which is capable of modulating white light to produce colored light.

Summary

Briefly a presently preferred embodiment of this invention includes a modulator for modulating incident beams of light, the modulator comprising a plurality of equally spaced apart grating elements, each of which includes a light reflective planar surface. The elements are arranged parallel to each other with their light reflective surfaces parallel to each other. The modulator includes means for supporting the elements in relation to one another and means for moving the elements relative to one another so that the elements move between a first configuration wherein the modulator acts to reflect the incident beam of light as a plane mirror, and a second configuration wherein the modulator diffracts the incident beam of light as it is reflected therefrom. In operation, the light reflective surfaces of the elements remain parallel to each other in both the first and the second configurations and the perpendicular spacing between the reflective surfaces of adjacent elements is equal to m/4 times the wavelength of the incident rays of light, wherein m=an even whole number or zero when the elements are in the first configuration and m=an odd number when the beam elements are in the second configuration.

One embodiment of this invention includes a reflective deformable grating light modulator, with a grating amplitude that can be controlled electronically, consisting of a reflective substrate with a deformable grating suspended above it. In its undeformed state, with no voltage applied between the elements of the grating and the substrate, the grating amplitude is one half of the wavelength of the incoming light. Since the round-trip path difference between the light reflected from the top and bottom of the grating is one wavelength, no diffraction occurs. When a voltage is applied between the grating elements and the substrate, the electrostatic force pulls the elements down to cause the grating amplitude to become one quarter of the wavelength so that reflections from the elements and the substrate add destructively, causing the light to be diffracted. If the detection system for the reflected light has a numerical aperture which accepts only the zero order beam, a mechanical motion of only one quarter of a wavelength is sufficient to modulate the reflected light with high contrast.

Typically the grating is formed by lithographically etching a film made of silicon nitride, aluminum, silicon dioxide or any other material which can be lithographically etched.

The deformable grating modulator of this invention has the advantage that it is implemented in silicon technology, using micromachining and sacrificial etching of thin films to fabricate the gratings. Circuitry for addressing and multiplexing can be manufactured on the same silicon substrate and thus be directly integrated with the modulator. Direct integration with electronics is an important advantage over non-silicon based technologies like liquid crystal and electrooptic SLMs. Moreover, the device demonstrates simplicity of fabrication and can be manufactured with only a few lithographic steps.

A further advantage of the deformable grating modulator is that because the deformable grating modulator utilizes diffraction rather than deflection of a light beam, the required mechanical motions are reduced from several microns (as in deformable mirror devices) to tenths of a micron, thus allowing for a potential three orders of magnitude in increase in speed. This speed is comparable to the fastest liquid crystal modulators, but without the device suffering the same complexity in the manufacturing process.

Still a further advantage of these devices is that the required motion of the grating elements is only one quarter of a wavelength, which means that elements with high resonance frequencies can be used.

These and other objects and advantages of the present invention will no doubt become apparent to those skilled in the art after having read the following detailed description of the preferred embodiment which is illustrated in the several figures of the drawing.

IN THE DRAWING

This invention will now be further illustrated with reference to the accompanying drawing in which:

FIG. 1(a)–(d) are cross-sections through a silicon substrate illustrating the manufacturing process of a reflective, deformable diffraction grating according to one embodiment of the invention;

Figure 3:
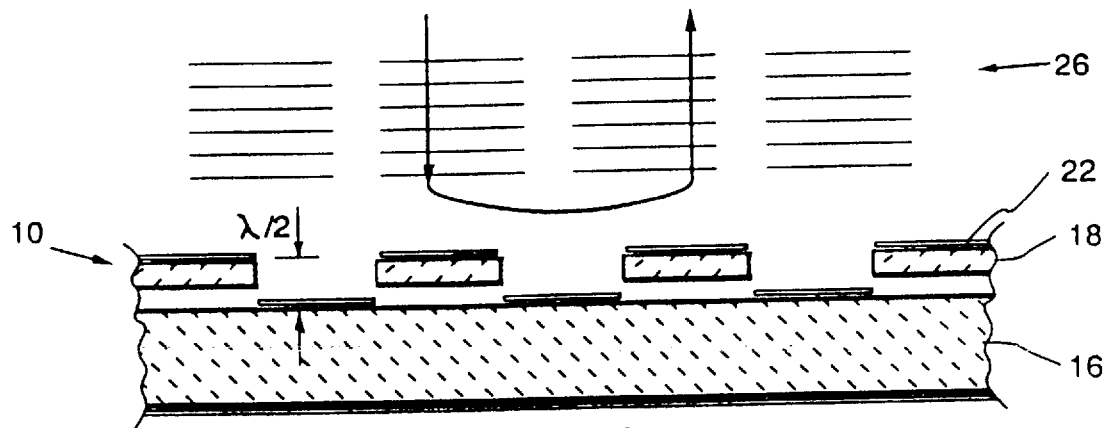
FIG. 3 illustrates the operation of the grating of FIG. 2 in its "non-defracting" mode.
Figure 4:
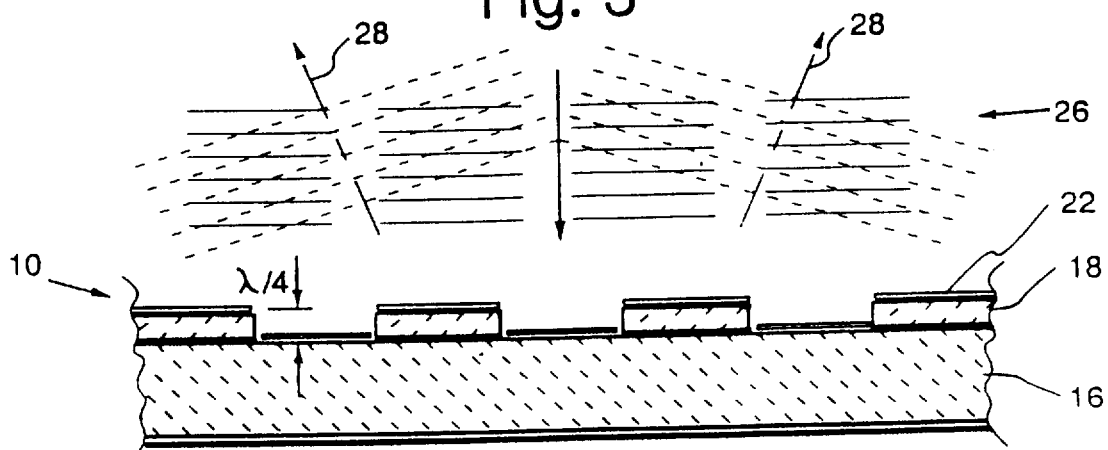
Figure 5:
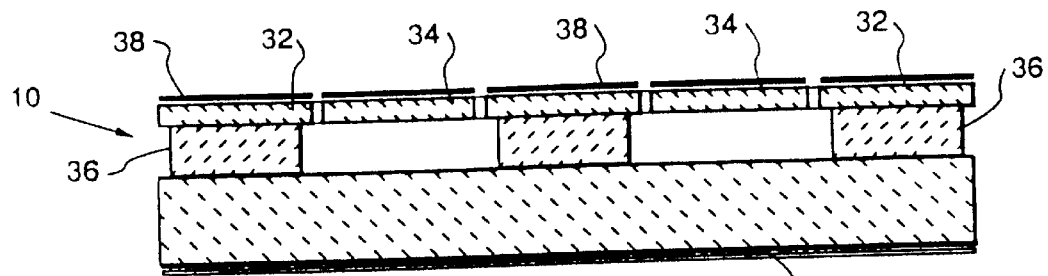
Figure 6:
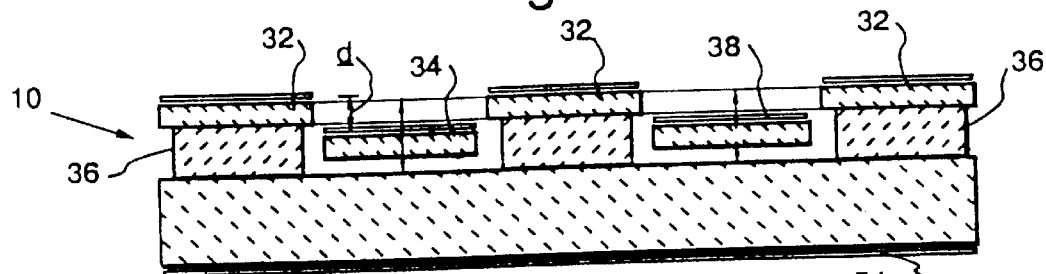
Figure 7:
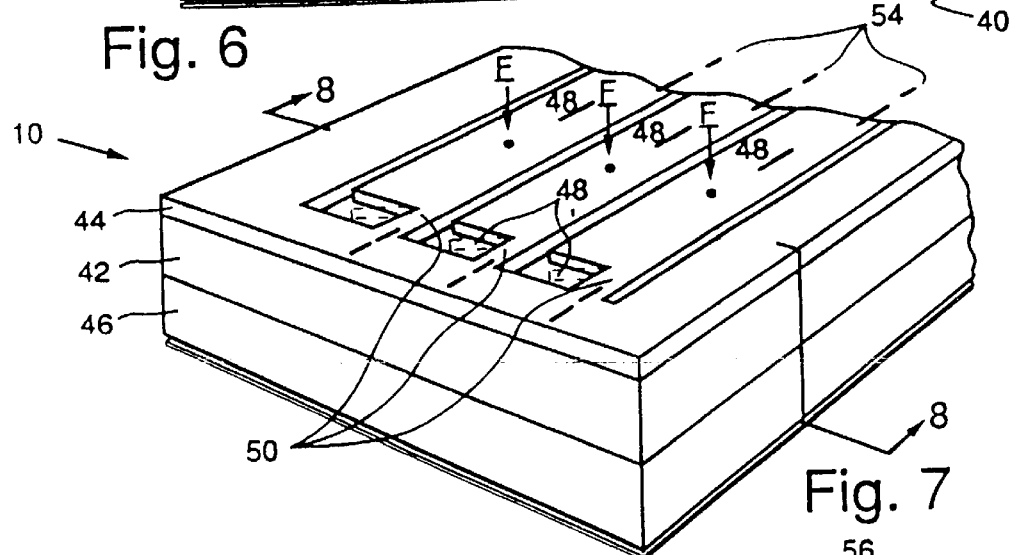
Figure 8:
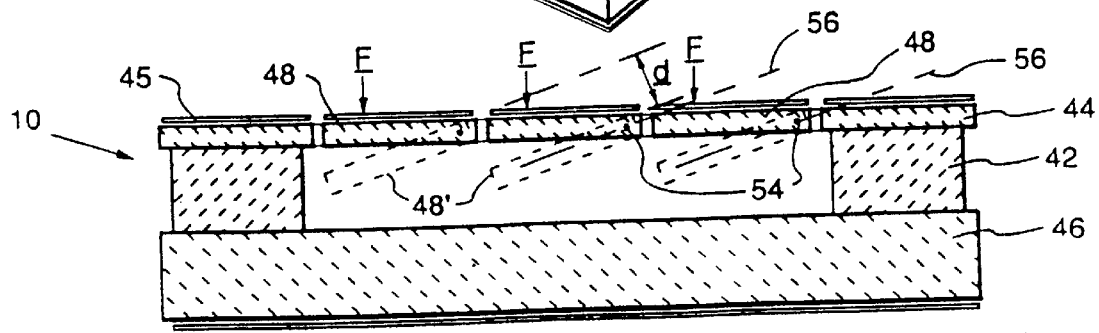
Figure 9:
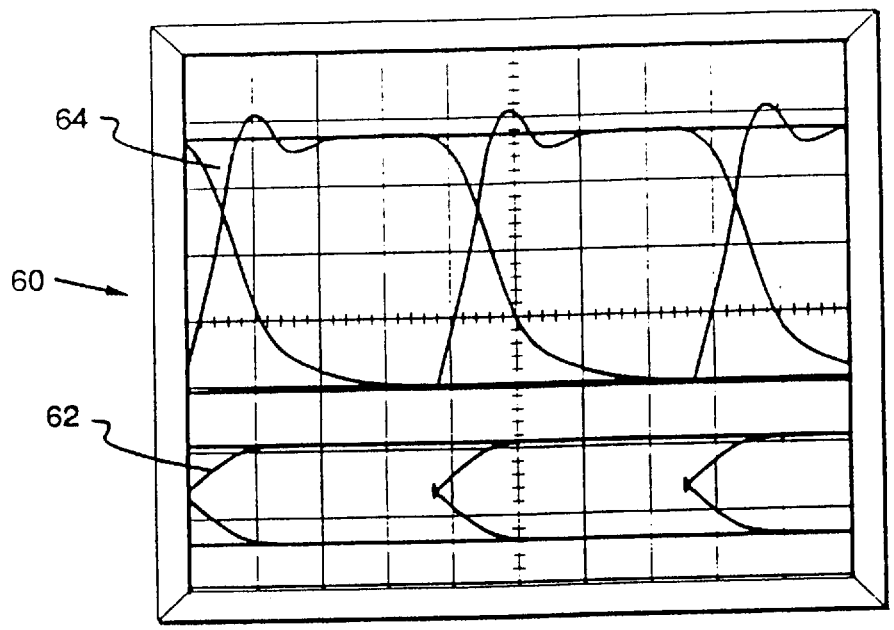
Figure 10:
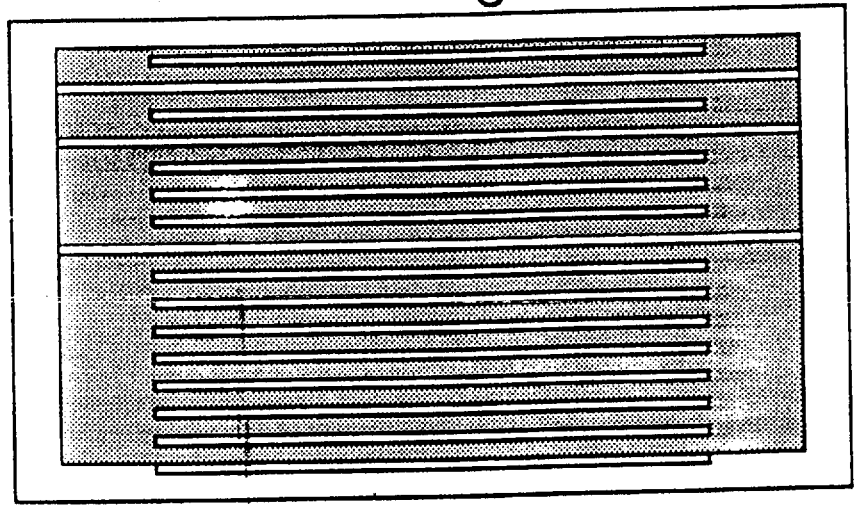
Figure 11:
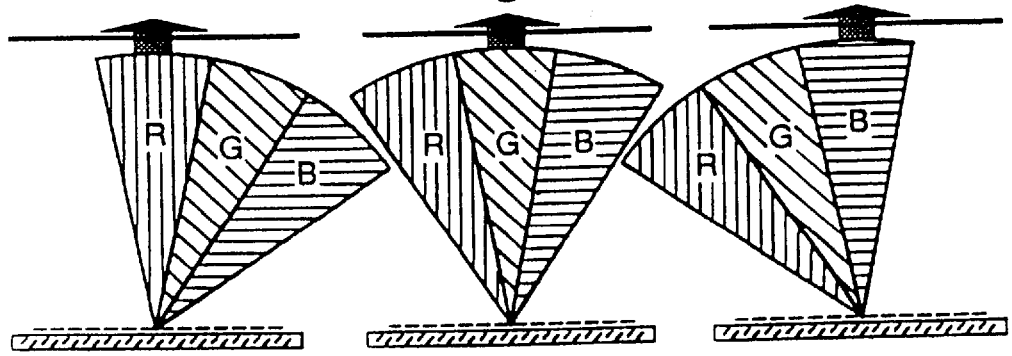
Figure 5:
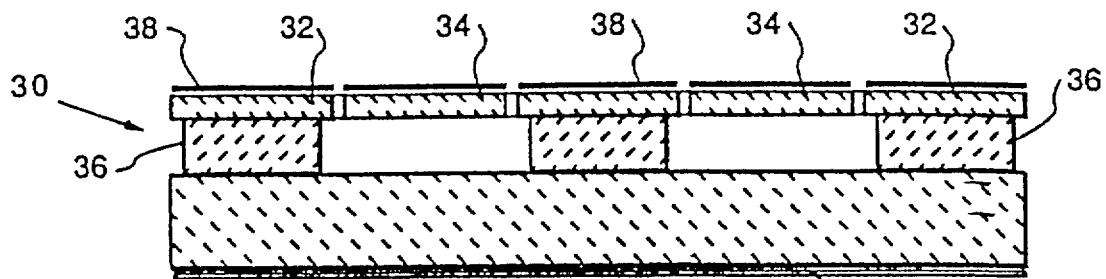
Figure 6:
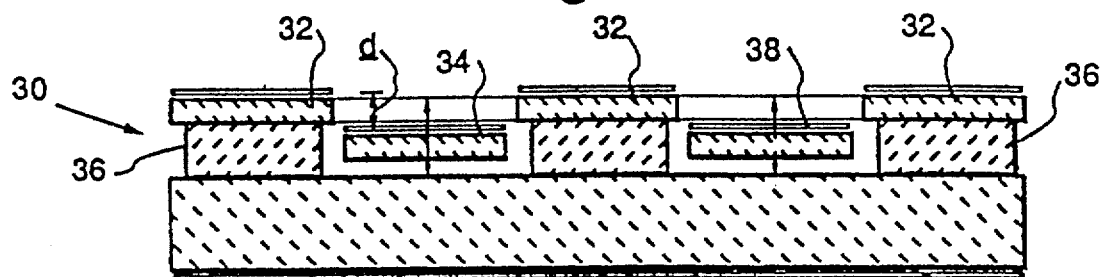
Figure 7:
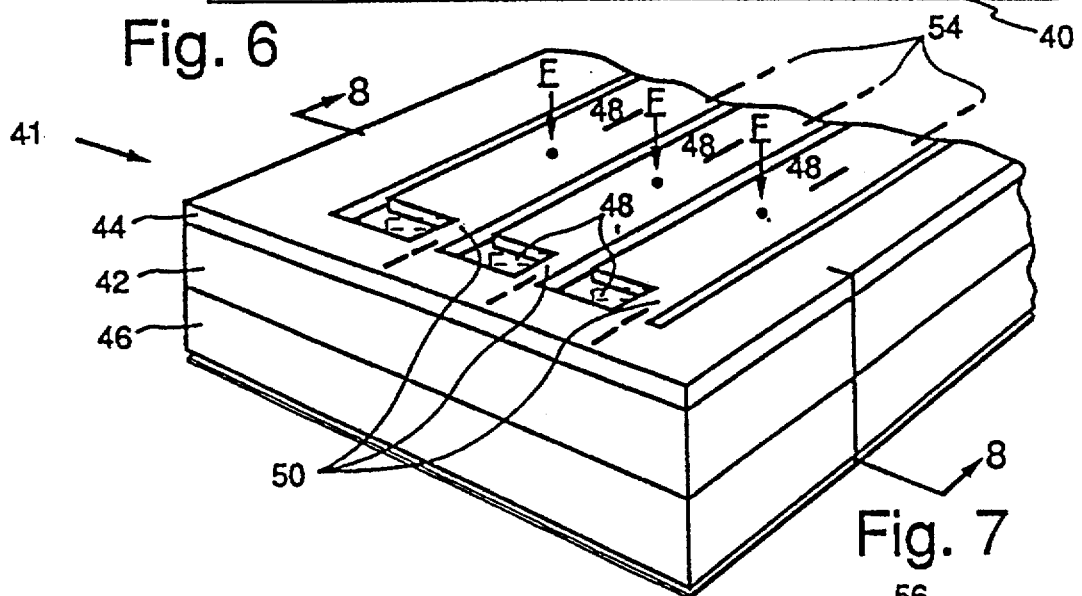
Figure 8:
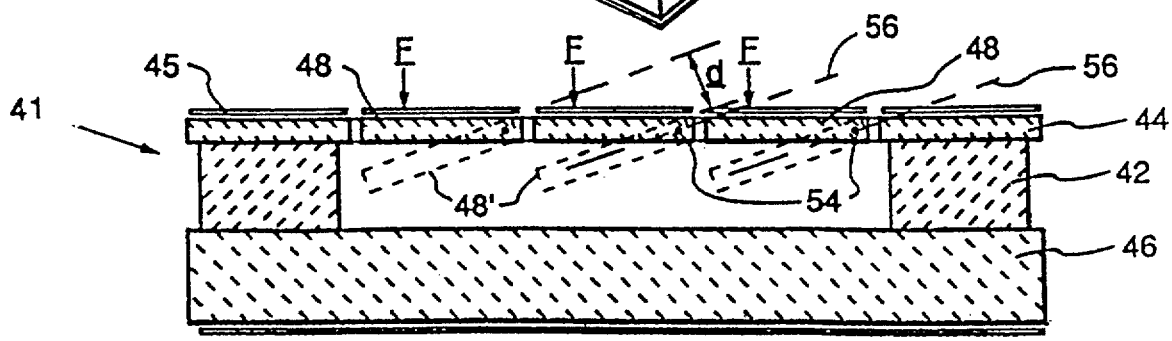
Figure 9:
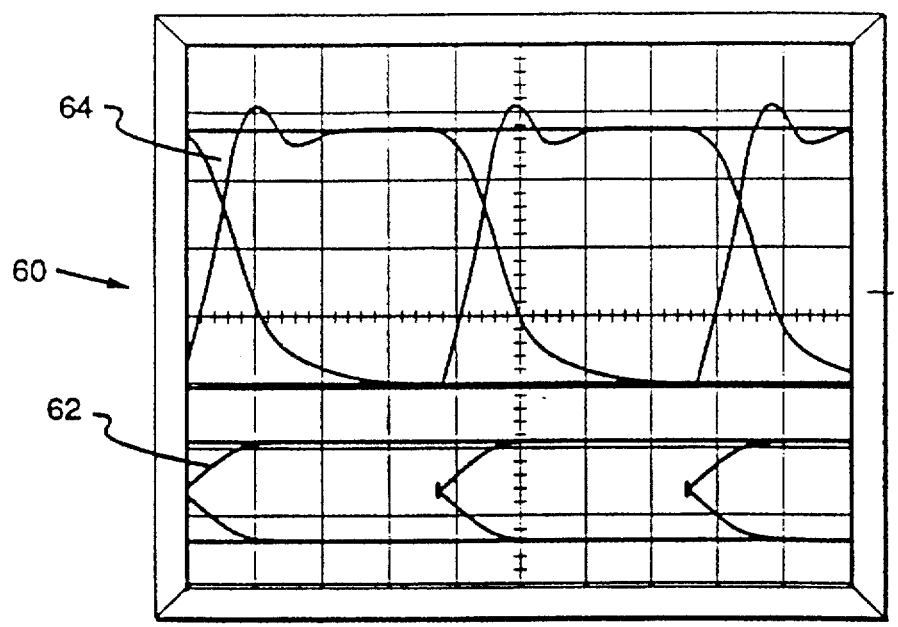
Figure 10:
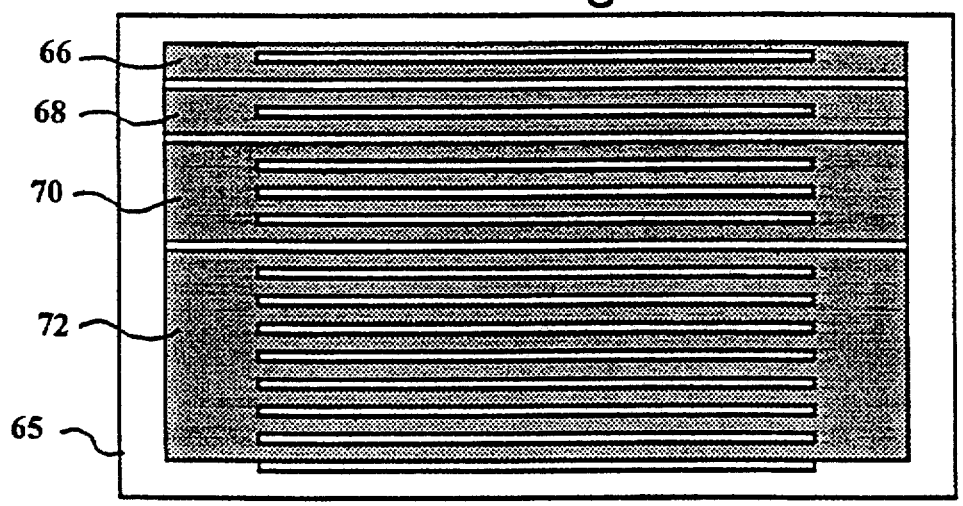
Figure 11:
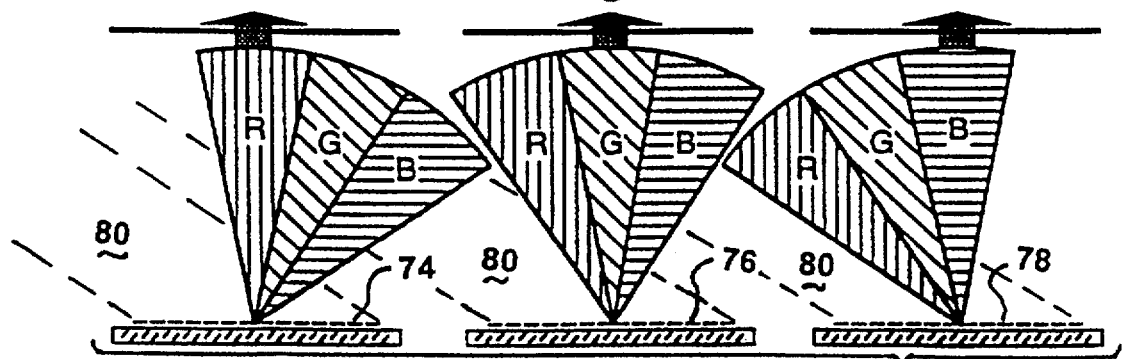

FIG. 4 and illustrates the operation of the grating of FIG. 3 in its "diffracting" mode;

FIG. 5 is a cross-section similar to that in FIG. 3, illustrating an alternative embodiment of the grating in its "non-defracting" mode;

FIG. 6 is a cross-section similar to that in FIG. 4, illustrating the grating in FIG. 5 in its "defracting" mode;

FIG. 7 is a pictoral view illustrating a further embodiment of the grating;

FIG. 8 is a cross-section along line 8—8 in FIG. 7;

FIG. 9 is a graphical representation of the modulation of a laser beam by the grating of the invention;

FIG. 10 is an illustration of how the diffraction grating of the invention can be combined with other gratings to form a complex modulator; and FIG. 11 illustrates the operation of the grating in the modulation of colored light.

DESCRIPTION OF PREFERRED EMBODIMENTS

The fabrication steps required to produce a reflective deformable grating 10 according to this invention are illustrated in FIG. 1(a)–(d).

Figure 1A:
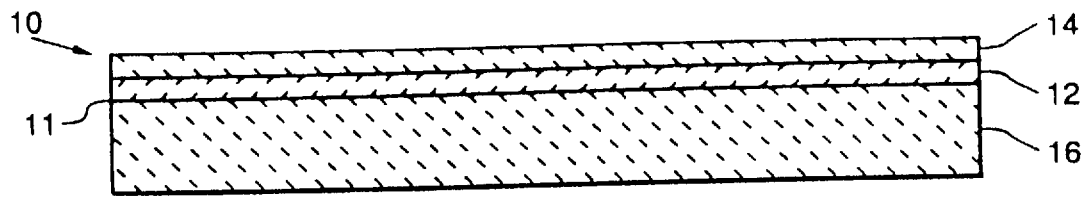

The first step, as illustrated in FIG. 1(a), is the deposition of an insulating layer 11 made of stoichemetric silicon nitride topped with a buffer layer of silicon dioxide followed by the deposition of a sacrificial silicon dioxide film 12 and a low-stress silicon nitride film 14, both 213 nm thick, on a silicon substrate 16. The low-stress silicon nitride film 14 is achieved by incorporating extra silicon (beyond the stoichiometric balance) into the film, during the deposition process. This reduces the tensile stress in the silicon nitride film to roughly 200 MPa.

Figure 1B:
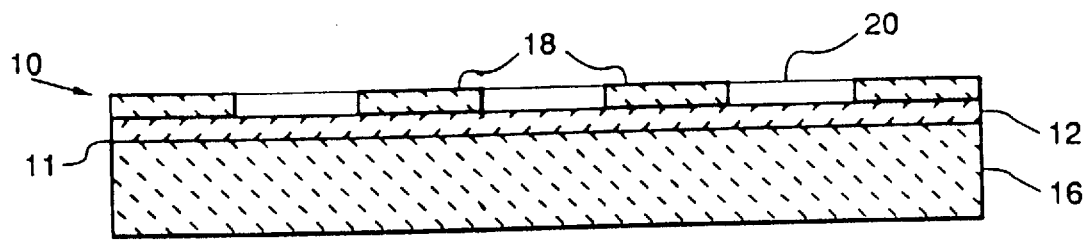

In the second step, which is illustrated in FIG. 1(b), the silicon nitride film 14 is lithographically patterned into a grid of grating elements in the form of elongate elements 18. In an individual grating, all the elements are of the same dimension and are arranged parallel to one another with the spacing between adjacent elements equal to the beam width. Depending on the design of the grating, however, the elements could typically be 1, 1.5 or 2 $\mu$m wide with a length that ranges from 10 $\mu$m to 120 $\mu$m. After this lithographic patterning process a peripheral silicon nitride frame 20 remains around the entire perimeter of the upper surface of the silicon substrate 16. This frame 20 is further illustrated in FIG. 2 and will be more fully described below with reference to that figure.

Figure 1C:
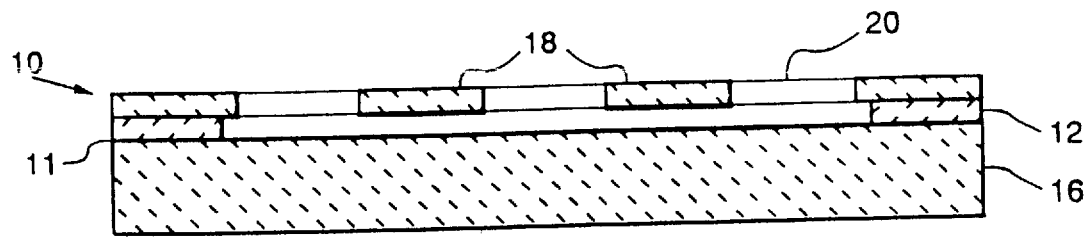

After the patterning process of the second step, the sacrificial silicon dioxide film 12 is etched in hydrofluoric acid, resulting in the configuration illustrated in FIG. 1(c). It can be seen that each element now forms a free standing silicon nitride bridge, 213 nm thick, which is suspended a distance of 213 nm (this being the thickness of the etched away sacrificial film 12) clear of the silicon substrate. As can further be seen from this figure the silicon dioxide film 12 is not entirely etched away below the frame 20 and so the frame 20 is supported, a distance of 213 nm, above the silicon substrate 16 by this remaining portion of the silicon dioxide film 12. The elements 18 are stretched within the frame and kept straight by the tensile stress imparted to the silicon nitride film 14 during the deposition of that film.

Figure 1D:
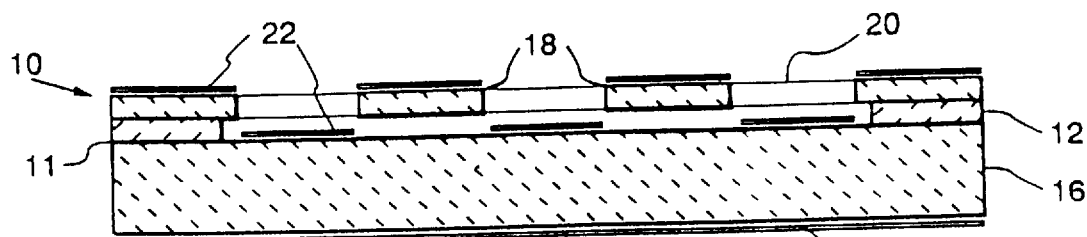

The last fabrication step, illustrated in FIG. 1(d), is sputtering, through a stencil mask, of a 50 nm thick aluminum film 22 to enhance the reflectance of both the elements 18 and the substrate 16 and to provide a first electrode for applying a voltage between the elements and the substrate. A second electrode is formed by sputtering an aluminum film 24, of similar thickness, onto the base of the silicon substrate 16.

Figure 2:
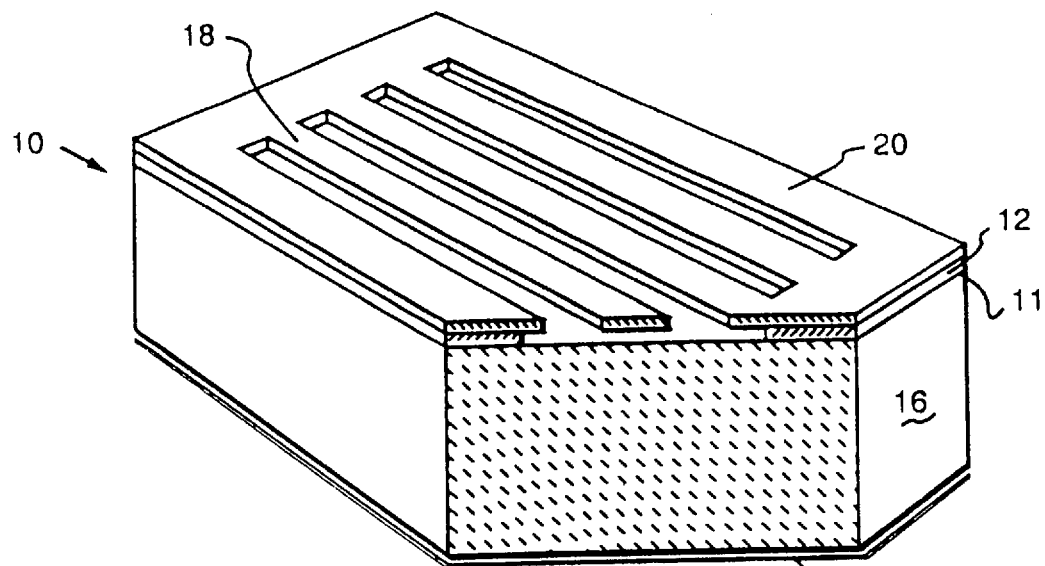
FIG. 2 is an isometric, partially cut-away view of the diffraction grating, the manufacture of which is illustrated in FIG. 1.

The final configuration of the grating is illustrated in FIG. 2. Here it can be seen that the elements 18 together with the frame 20 define a grating which, as will be later explained, can be used for modulating a light beam. Furthermore, and as can be gathered from the above described manufacturing process, the frame 20 is formed integrally with the elements 18 and thus provides a relatively rigid supporting structure which maintains the tensile stress within the elements 18. In so doing, and as the frame 20 is supported by the remainder of the, silicon dioxide film 12 that was not etched away, the elements are kept straight and a distance of 213 nm above the surface of the silicon substrate 16.

The operation of the deformable grating 10, formed by the above process, is illustrated with reference to FIG. 3 and 4. Before commencing the description of how the grating operates, however, it should be recalled that, in this case, each of the elements 18 are 213 nm thick and are suspended a distance of 213 nm clear of the substrate 16. This means that the distance from the top of each element to the top of the substrate is 426 nm. Similarly, the distance between the top of the reflective surface on the elements to the top of the reflective surface on the substrate is also 426 nm. This distance is known as the grating amplitude.

In FIG. 3 the grating 10 is shown with no voltage applied between the substrate 16 and the individual elements 18, and with a lightwave, generally indicated as 26, of a wavelength $\lambda$=852 nm incident upon it. The grating amplitude of 426 nm is therefore equal to half of the wavelength of the incident light and, therefore, the total path length difference for the light reflected from the elements and from the substrate equals the wavelength of the incident light. As a result, light reflected from the elements and from the substrate add in phase and the grating 10 acts to reflect the light as a flat mirror.

However, as illustrated in FIG. 4, when a voltage is applied between the elements 18 and the substrate 16 the electrostatic forces pull the elements 18 down onto the substrate 16, with the result that the distance between the top of the elements and the top of the substrate is now 213 nm. As this is one quarter of the wavelength of the incident lights, the total path length difference for the light reflected from the elements and from the substrate is now one half of the wavelength (426 nm) of the incident light and the reflections interfere destructively, causing the light to be diffracted, indicated as 28.

Thus, if this grating is used in combination with a system, for detecting the reflected light, which has a numerical aperture sized to detect one order of diffracted light from the grating e.g., the zero order, this grating can be used to modulate the reflected light with high contrast.

In FIGS. 5 and 6 an alternative embodiment of the diffraction grating 30 of the invention is illustrated. In this embodiment the grating 30 consists of a plurality of equally spaced, equally sized, fixed elements 32 and a plurality of equally spaced, equally sized, movable elements 34 in which the movable elements 34 lie in the spaces between the fixed elements 32. Each fixed element 32 is supported on and held in position by a body of supporting material 36 which runs the entire length of the fixed element 32. The bodies of material 36 are formed during a lithographic etching process in which the material between the bodies 36 is removed.

As can be seen from FIG. 5 the fixed elements 32 are arranged to be coplanar with the movable elements 34 and present a flat upper surface which is coated with a reflective layer 38. As such the grating 30 acts as a flat mirror when it reflects incident light, however, when a voltage is applied between the elements and an electrode 40 at the base of the grating 30 the movable elements 34 move downwards as is illustrated in FIG. 6. By applying different voltages the resultant forces on the elements 34 and, therefore, the amount of deflection of the movable elements 34 can be varied. Accordingly, when the grating amplitude (defined as the perpendicular distance d between the reflective layers 38 on adjacent elements is m/4 times the wavelength of the light incident on the grating 30, the grating 30 will act as a plane mirror when m=0, 2, 4 . . . (i.e. an even number or zero) and as a reflecting diffraction grating when m=1, 3, 5 . . . (i.e. an odd number). In this manner the grating 30 can operate to modulate incident light in the same manner as the grating 10 illustrated in FIGS. 1 to 4.

Yet another embodiment of the diffraction grating of the invention is illustrated in FIGS. 7 and 8. As with the grating 10 in FIGS. 1 to 4 this grating 41 consists of a sacrificial silicon dioxide film 42, a silicon nitride film 44 and a substrate 46. In this embodiment, however, the substrate 46 has no reflective layer formed thereon and only the silicon nitride film 44 has a reflective coating 45 formed thereon. As is illustrated in FIG. 7 the deformable elements 48 are coplanar in their undeformed state and lie close to one another so that together they provide a substantially flat reflective surface. The elements 48 are, however, formed with a neck 50 at either end, which is off-center of the longitudinal center line of each of the elements.

When a uniformly distributed force, as a result of an applied voltage for example, is applied to the elements 48 the resultant force F, for each element 48, will act at the geometric center 52 of that element. As each resultant force F is off-set from the axis of rotation 54 (which coincides with the centerline of each neck 50), a moment of rotation or torque is applied to each element 48 which results in a rotation of each element 48 about its axis 54 to the position 48' indicated in broken lines. This is known as "blazing" a diffraction grating.

As can be seen from FIG. 8, the reflective planes 56 of the elements 48 remain parallel to each other even in this "blazed" configuration and therefore, the grating amplitude d is the perpendicular distance between the reflective surfaces of adjacent elements. This "blazed" grating will operate to diffract light in the same manner as a sawtooth grating.

Although not illustrated in any of FIGS. 1 to 8, it will be apparent that a deformable diffraction grating can be constructed in which, in its undeformed state, all the reflective elements are in the form of movable elements arranged parallel, adjacent and coplanar with each other. In this type of grating not only the grating amplitude (i.e., the perpendicular distance between adjacent reflective surfaces) can be varied but also the average height of all the reflective surfaces can be changed by moving all the elements relative to a fixed datum. This arrangement has the advantage that both the amplitude and the phase of the reflected/diffracted light can be modulated.

The electrical, optical and mechanical characteristics of a number of modulators, similar in design to the modulator illustrated with reference to FIGS. 1 to 4 but of different dimensions were investigated by using a Helium Neon laser (of 633 nm wavelength) focused to a spot size of 36 $\mu$m on the center portion of each modulator. This spot size is small enough so that the curvature of the elements in the region where the modulator was illuminated can be neglected, but is large enough to allow the optical wave to be regarded as a plane wave and covering enough grating periods to give good separation between the zero and first order diffraction modes resulting from the operation of the grating. It was discovered that grating periods of (i.e.) the distance between the centerlines of two adjacent elements in the grating, 2, 3 and 4 $\mu$m and a wavelength of 633 nm resulted in first order diffraction angles of 18°, 14° and 9° respectively.

One of these first order diffracted light beams was produced by using a 120 $\mu$m-long grating modulator with 1.5 $\mu$m-wide elements at atmospheric pressure together with a HeNe light beam modulated at a bit rate of 500 kHz. detected by a low-noise photoreceiver and viewed on an oscilloscope. The resulting display screen 30 of the oscilloscope is illustrated in FIG. 9.

However, before proceeding with a discussion of the features illustrated in this figure, the resonant frequency of the grating elements should first be considered.

The resonant frequency of the mechanical structure of the grating of the invention was measured by driving the deformable grating modulator with a step function and observing the ringing frequency. The area of the aluminum on the deformable grating modulator is roughly 0.2 cm$^2$, which corresponds to an RC limited 3-dB bandwidth of 1 MHz with roughly 100 ohms of series resistance. This large RC time constant slowed down the step function, however, enough power existed at the resonant frequency to excite vibrations, even in the shorter elements. Although the ringing could be observed in normal atmosphere, the Q-factor was too low (approximately 1.5) for accurate measurements, so the measurements were made at a pressure of 150 mbar. At this pressure, the Q-factor rose to 8.6, demonstrating that air resistance is the major damping mechanism, for a grating of this nature, in a normal atmosphere.

Nonetheless, it was found that due to the high tensile stress in the elements, tension is the dominant restoring force, and the elements could therefore be modeled as vibrating strings. When this was done and the measured and theoretically predicted resonance frequencies compared, it was found that the theory is in good agreement with the experimental values, particularly when considering the uncertainty in tensile stress and density of the elements. As it is known that the bandwidth of forced vibrations of a mechanical structure is simply related to the resonance frequency and Q-factor, a Q-factor of 1.5 yields a 1.5 dB bandwidth of the deformable grating modulator 1.4 times larger than the resonance frequency. The range of bandwidths for these gratings is therefore from 1.8 MHz for the deformable grating modulator with 120 $\mu$m elements to 6.1 MHz for the deformable grating modulator with 40 $\mu$m elements.

Returning now to FIG. 9, it should be noted that with an applied voltage swing of 3 V, a contrast of 16 dB for the 120 $\mu$m-long bridges could be observed. Here the term "modulation depth" is taken to mean the ratio of the change in optical intensity to peak intensity.

The input (lower trace 62) on the screen 60 represents a pseudo-random bit stream switching between 0 and −2.7 V across a set of grating devices on a 1 cm by 1 cm die. The observed switching transient with an initial fast part followed by a RC dominated part, is caused by the series resistance of the deformable grating modulator, which is comparable to a 50 ohm source resistance.

The output (upper trace 64) on the screen corresponds to the optical output of a low-noise photoreceiver detecting the first diffraction order of the grating used. The output (upper trace 64) from the deformable grating is high when the elements are relaxed and low when the elements are deflected. Ringing is observed only after the rising transient, because of the quadratic dependence of the electro-static force on the voltage (during switching from a voltage of −2.7 V to 0 V, the initial, faster part of the charging of the capacitor corresponds to a larger change in electrostatic force, than when switching the opposite way). This ringing in the received signal indicates a decay close to critical damping.

Furthermore, it was found that because the capacitance increases as the elements are pulled toward the substrate, the voltage needed for a certain deflection is not a monotonically increasing function of this deflection. At a certain applied voltage condition, an incremental increase in the applied voltage causes the elements to be pulled spontaneously to the substrate (to latch) and this voltage is known as the "switching voltage" of the modulator. The switching voltage was found to be 3.2 V for gratings with 120 $\mu$m long elements and, if it is assumed that tension dominates the restoring forces, the switching voltage is inversely proportional to the element length and therefore, the predicted switching voltage for 40 $\mu$m long elements will be 9.6 V.

The importance of the switching voltage is that below this voltage, the deformable grating modulator can be operated in an analog fashion, however, if a voltage greater than the switching voltage is applied to the modulator it acts in a digital manner. Nonetheless, it is important to note that operating the modulator to the point of contact is desirable from an applications point of view, because as discussed above when the elements are deflected electrostatically, an instability exists once the element deflection goes beyond the halfway point. This results in hysteretic behavior which will "latch" the element in the down position. This latching feature gives the modulator the advantages of an active matrix design without the need for active components. A further advantage of this latching feature is that once the element has "latched" it requires only a very small "holding voltage", much smaller than the original applied voltage, to keep the element its latched configuration. This feature is particularly valuable in low power applications where efficient use of available power is very important.

Finally, it was discovered that when the elements of the modulators are brought into contact with the substrate they could stick. This can be solved by adding small ridges below the beams to reduce the contact area between the beams and the substrate and thereby reduce the sticking problem.

The use of the modulator of this invention in displays requires high yield integration of individual modulator elements into 2-D arrays of modulator devices. The modulator devices may be comprised of multiple modulator components such as that illustrated in FIG. 10 which shows a plurality of grating modulator components combined to form a single modulator unit 65 which can be used to provide a gray-scale operation. Each of the individual modulator components 66, 68, 70, 72 consist of a number of elements and gray-scale can be obtained by addressing each modulator in a binary-weighted manner. The hysteresis characteristic for latching (as described above) can be used to provide gray-scale variation without analog control of the voltage supplied to individual grating modulator elements.

In FIG. 11 the use of the grating, in combination with other gratings, for modulating white light to produce colored light is illustrated. This approach takes advantage of the ability of a grating to separate a light spectrum into its constituent colors. By constructing modulator devices 73 including three separate red, green and blue modulation components 74, 76, and 78 each with a grating designed to diffract the appropriate color into an optical system (not shown) a color display which is white light illuminated by a light beam 80 can be achieved. Although shown separated for purposes of illustration, it will be appreciated that the three modulation components 74, 76, and 78 could be positioned contiguous to each other as are the components 66–72 in FIG. 10 to form a single modulator device 73. This approach is attractive for large area projection displays.

In summary, the reflective, deformable grating light modulator of this invention is a device which exhibits high resolution (40 by 40 $\mu$m$^2$ to 100 $\mu$m$^2$); high response times/large bandwidth (2 to 6 MHz); high contrast ratio (close to 100% modulation with a 3V switching voltage); is polarization independent and easy to use. This device also has tolerance for high optical power, has good optical throughput, is simple to manufacture, CMOS compatible, and has application in a wide range of fields including use as an SLM and with fiber optic technology.

Although the present invention has been described above in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A light modulator configured for receiving a beam of multi-frequency light and for diffracting light having a composite of a subset of frequencies of the multi-frequency light in a predetermined direction, the modulator comprising at least two spatially separate sets of gratings each having a different grating period such that a first grating diffracts light of a first frequency of light from the multi-frequency light in the predetermined direction and the second grating diffracts light of a second frequency in the predetermined direction wherein the light diffracted by each set of gratings in the predetermined direction allows perception of a color which is intermediate to colors corresponding with the first and second frequencies.

2. The light modulator according to claim 1 wherein each set of gratings comprises:

a. a plurality of elongated elements, each including a light reflective planar surface, the elements being arranged parallel to each other and with the light reflective surfaces of the elements selectably lying in a single parallel plane and a plurality of parallel planes;

b. means for supporting the elements in a relation to one another such that the elements are spaced at a predetermined grating period; and c. means for moving a first set of the elements in a direction normal to said planes and relative to a second set of the elements, and between a first configuration wherein said first and second sets of elements act to reflect the incident beam of light as a plane mirror, and a second configuration wherein said first and second sets of elements diffract the incident beam of light as it is reflected from the surfaces of the elements.

3. The light modulator according to claim 1, wherein each sets of the gratings reflects the beam of multi-frequency light as a plane mirror in a first configuration, and diffracts the beam of multi-frequency light in a second configuration.

4. A light modulator configured for receiving a beam of multi-frequency light and for diffracting light having a composite of a subset of frequencies of the multi-frequency light in a predetermined direction, the modulator comprising at least two spatially separate sets of gratings each having a different grating period such that a first grating diffracts light of a first frequency of light from the multi-frequency light in the predetermined direction and the second grating diffracts light of a second frequency in the predetermined direction wherein the light diffracted by each set of gratings is directed to the predetermined direction thereby allowing perception of a color which is intermediate to colors corresponding with the first and second frequencies.

5. The light modulator according to claim 4 wherein each grating set has a predetermined grating period, such that each grating period is selected to diffract light of a particular frequency in the predetermined direction.

6. The light modulator according to claim 5 further comprising an optical collection system configured to collect light diffracted from the grating sets.

7. A light modulator configured for receiving a beam of multi-frequency light and for diffracting light having a composite of a subset of frequencies of the multi-frequency light in a predetermined direction, the modulator comprising at least two spatially separate sets of gratings each having a different grating period such that a first grating diffracts light of a first frequency of light from the multi-frequency light in the predetermined direction and the second grating diffracts light of a second frequency in the predetermined direction and a diffraction control apparatus configured to control each of the sets of gratings to selectively diffract light wherein the light diffracted by each set of gratings in the predetermined direction allows perception of a color which is intermediate to colors corresponding with the first and second frequencies.

8. The light modulator according to claim 7 wherein each of the sets of gratings diffracts light in a first mode and reflects light in a second mode.

9. A color display system comprising:
   a. a multi-frequency light source for forming a multi-frequency light beam;
   b. a plurality of optical devices, each mounted to receive the light beam wherein each of the optical devices is selectably configurable to diffract a particular frequency of the light beam in a same predetermined direction for forming a plurality of diffracted beams; and
   c. an optical collection system mounted to receive the diffracted beams for forming an image.

10. The color display system according to claim 9 wherein the light source generates white light.

11. The color display system according to claim 9 wherein the optical devices are configured to diffract a particular frequency of the light beam by each having a predetermined diffraction period selected to diffract the particular of light in the predetermined direction.

12. At least two modulators for modulating an incident beam of light, each comprising:
   a. a plurality of elongated elements, each including a light reflective planar surface, the elements being arranged parallel to each other and with the light reflective surfaces of the elements lying in at least one parallel plane;
   b. means for supporting the elements in a relation to one another such that the elements in each modulator are spaced at a predetermined grating period; and
   c. means for moving a first set of the elements in a direction normal to said planes and relative to a second set of the elements, and between a first modulator configuration wherein said first and second sets act to reflect the incident beam of light as a plane mirror, and a second modulator configuration wherein said first and second sets diffract the incident beam of light as it is reflected from the surfaces of the elements wherein each modulator has a different grating period such that a first modulator diffracts a first frequency of light from the incident beam of light in a predetermined direction and a second modulator diffracts a second frequency of light from the incident light in the predetermined direction for allowing perception of a color which is intermediate to colors corresponding with the first and second frequencies.

13. A color display system comprising:
   a. a multi-frequency light source for forming a multi-frequency light beam; and
   b. at least two modulators for modulating an incident beam of light, each comprising:
      (1) a plurality of elongated elements, each including a light reflective planar surface, the elements being arranged parallel to each other and with the light reflective surfaces of the elements lying in at least one parallel plane;
      (2) means for supporting the elements in a relation to one another such that the elements in each modulator are spaced at a predetermined grating period; and
      (3) means for moving a first set of the elements in a direction normal to said planes and relative to a second set of the elements, and between a first modulator configuration wherein said first and second sets act to reflect the incident beam of light as a plane mirror, and a second modulator configuration wherein said first and second sets diffract the incident beam of light as it is reflected from the surfaces of the elements wherein each modulator has a different grating period such that a first modulator diffracts a first frequency of light from the incident beam of light in a predetermined direction and a second modulator diffracts a second frequency of light from the incident beam of light in the predetermined direction for allowing perception of a color which is intermediate to colors corresponding with the first and the second frequencies.

14. A device for modulating an incident beam of light for forming color, the incident beam including a plurality of frequencies, the device comprising:
   a. a plurality of diffraction gratings; and
   b. means for selectively configuring each grating to diffract the incident beam of light;
wherein each diffraction grating is configured to diffract a predetermined frequency of light in a same predetermined direction for spatially directing each predetermined frequency of light diffracted by each diffraction grating for allowing perception of color which is intermediate to colors of a frequency of light from each of the diffraction gratings.

15. The device according to claim 14 wherein each grating comprises a plurality of reflective elements arranged parallel to each other for reflecting the incident beam in a first configuration and diffracting the incident beam in a second configuration.

16. The device according to claim 15 wherein the means for selectively configuring comprises means for moving a first group of reflective elements relative to a second group of reflective elements such that the first group and the second group lie in a plurality of parallel planes.

17. The device according to claim 14 wherein each diffraction grating has a different grating period for diffracting a predetermined frequency of light in a predetermined direction.

18. A device for modulating an incident beam of light, the incident beam including a plurality of frequencies, the device comprising:
   a. a first diffraction grating for diffracting light corresponding to a first frequency in a predetermined direction; and
   b. a second diffraction grating for diffracting light corresponding to a second frequency in the predetermined direction, wherein the first frequency corresponds to a first color and the second frequency corresponds to a second color, further wherein the first and second frequencies are spatially directed to allow perception of a third color.

19. The device according to claim 18 further comprising a third diffraction grating for diffracting light corresponding to a third frequency in the predetermined direction.

20. The device according to claim 19 wherein the first frequency corresponds to red light, the second frequency corresponds to green light and the third frequency corresponds to blue light.

21. The device according to claim 18 wherein the first and second diffraction gratings are independently configurable to diffract light.

22. The device according to claim 18 further comprising a plurality of additional display elements for forming a display image.

* * * * *

UNITED STATES PATENT AND TRADEMARK OFFICE
CERTIFICATE OF CORRECTION

PATENT NO. : 5,808,797
DATED     : September 15, 1998
INVENTOR(S) : David M. Bloom, et al.

It is certified that error appears in the above-identified patent and that said Letters Patent is hereby corrected as shown below:

The title page, should be deleted to be replaced with the attached title page.

Signed and Sealed this

Twenty-seventh Day of July, 1999

Attest:

Q. TODD DICKINSON

*Attesting Officer*    *Acting Commissioner of Patents and Trademarks*

United States Patent [19]

Bloom et al.

[11] Patent Number: 5,808,797
[45] Date of Patent: Sep. 15, 1998

[54] METHOD AND APPARATUS FOR MODULATING A LIGHT BEAM

[75] Inventors: David M. Bloom, Portolla Valley; Francisco S. A. Sandejas, Menlo Park; Olav Solgaard, Palo Alto, all of Calif.

[73] Assignee: Silicon Light Machines, Sunnyvale, Calif.

[21] Appl. No.: 638,605

[22] Filed: Apr. 26, 1996

Related U.S. Application Data

[60] Division of Ser. No. 591,231, Jan. 18, 1996, which is a continuation-in-part of Ser. No. 404,139, Mar. 13, 1995, Pat. No. 5,677,738, which is a division of Ser. No. 62,688, May 20, 1993, Pat. No. 5,459,610, which is a continuation-in-part of Ser. No. 876,078, Apr. 28, 1992, Pat. No. 5,311,360.

[51] Int. Cl.⁶ .................................................. G02B 5/18
[52] U.S. Cl. ........................ 359/572; 345/108; 348/755
[58] Field of Search .......................... 359/35, 573, 572; 349/86; 348/755; 345/31, 85, 108

[56] References Cited

U.S. PATENT DOCUMENTS

| Re. 16,767 | 10/1927 | Jenkins | 359/291 |
|---|---|---|---|
| 1,525,550 | 2/1925 | Jenkins | 359/291 |
| 1,548,262 | 8/1925 | Freedman | 283/67 |
| 1,814,701 | 7/1931 | Ives | 359/462 |
| 2,415,226 | 2/1947 | Sziklai | 178/5.4 |
| 2,783,406 | 2/1957 | Vanderhooft | 313/70 |
| 2,991,690 | 7/1961 | Grey et al. | 88/16.6 |
| 3,553,364 | 1/1971 | Lee | 178/7.3 |
| 3,576,394 | 4/1971 | Lee | 178/7.3 |
| 3,600,798 | 8/1971 | Lee | 29/592 |
| 3,656,837 | 4/1972 | Sandbank | 359/291 |

(List continued on next page.)

FOREIGN PATENT DOCUMENTS

| 0 417 039 A1 | 3/1991 | European Pat. Off. | G03B 21/20 |
|---|---|---|---|
| 0 610 665 A1 | 8/1994 | European Pat. Off. | G09G 3/34 |
| 0 658 868 A1 | 6/1995 | European Pat. Off. | G02F 1/34 |
| 63-305323 | 12/1988 | Japan | G02F 1/13 |
| WO 093/02269 | 2/1993 | WIPO | E06B 5/10 |
| WO 093/09472 | 5/1993 | WIPO | G03F 7/20 |

OTHER PUBLICATIONS

R. Apte, F. Sandejas, W. Banyai, D. Bloom. "Grating Light Valves For High Resolution Displays", Ginzton Laboratories, Stanford University, Stanford, CA 94305–4085, Jun. 1994.

R. Apte. Grating Light Valves For High Resolution Displays Jun. 1994, Ginzton Laboratories, Stanford Univ., Stanford, CA.

O. Solgaard, Integrated Semiconductor Light Modulators For Fiber–Optic And Display Applications, Feb., 1992, Stanford Univ., Stanford, CA.

(List continued on next page.)

*Primary Examiner*—Paul M. Dzierzynski
*Assistant Examiner*—John Juba, Jr.
*Attorney, Agent, or Firm*—Haverstock & Owens LLP

[57] ABSTRACT

A modulator for modulating incident rays of light, the modulator having a plurality of equally spaced apart elements, each of which includes a light reflective planar surface. The elements are arranged parallel to each other with their light reflective surfaces parallel to each other. The modulator includes means for supporting elements in relation to one another and means for moving particular ones of the elements relative to others so that the moved elements transit between a first configuration wherein the modulator acts to reflect the incident rays of light as a plane mirror, and a second configuration wherein the modulator diffracts the light reflected therefrom. In operation, the light reflective surfaces of the elements remain parallel to each other in both the first and the second configurations. The perpendicular spacing between the reflective surfaces of respective elements is equal to m/4 times the wavelength of the incident rays of light, wherein m=an even whole number or zero when the elements are in the first configuration and m=an odd whole number when the elements are in the second configuration.

22 Claims, 4 Drawing Sheets

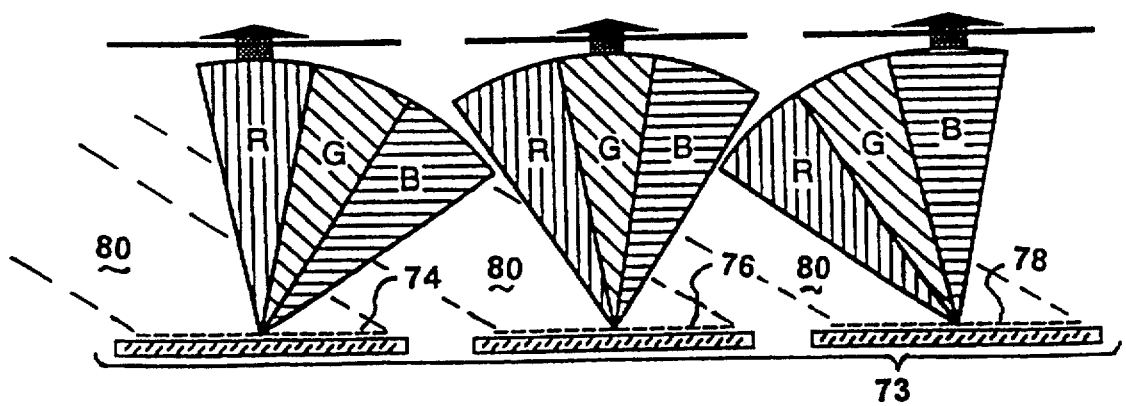

UNITED STATES PATENT AND TRADEMARK OFFICE
CERTIFICATE OF CORRECTION

Page 3 of 5

PATENT NO. : 5,808,797
DATED : September 15, 1998
INVENTOR(S) : David M. Bloom, et al.

It is certified that error appears in the above-identified patent and that said Letters Patent is hereby corrected as shown below:

On the title page, item [54]:
IN THE REFERENCES CITED:
Under U.S. Patent Documents, add -- 4,389,096  6/1983  Hori et al.  350/339R--.
On Page 2, delete "4,714,236" and insert --4,714,326--; delete "4,772,593 9/1988" and insert --4,722,593 2/1988--; delete "5,176,274" and insert --5,179,274--.
IN THE ABSTRACT:
On line 6 of the Abstract, insert --the-- between "supporting" and "elements".
IN THE DRAWINGS:
Replace Figures 5-11 on Sheets 3-4 of 4 with the attached two sheets of drawings.
IN THE SPECIFICATION:
In Col. 1, line 55, delete "SIMs" and insert --SLMs--. In Col. 4, line 67, delete "colored light" and insert --white light to produce color-- between "modulation of" and ".". In Col. 5, line 34, add --18-- between "element " and "now". In Col. 7, line 10, add --48-- after "elements' and before "."; and in line 61, delete "30" and insert --60-- between "screen" and "of". In Col. 9, line 19, insert --in-- between "elements" and "its".
IN THE CLAIMS:
In Claim 11, Col. 11, line 25, insert --frequency-- between "particular" and "of".